(12) United States Patent
Gruhl et al.

(10) Patent No.: US 8,380,688 B2
(45) Date of Patent: Feb. 19, 2013

(54) METHOD AND APPARATUS FOR DATA COMPRESSION

(75) Inventors: Daniel F. Gruhl, San Jose, CA (US);
Jan H. Pieper, San Jose, CA (US);
Mark A. Smith, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 12/613,597

(22) Filed: Nov. 6, 2009

(65) Prior Publication Data

US 2011/0113016 A1    May 12, 2011

(51) Int. Cl.
*G06F 7/00* (2006.01)
*G06F 17/00* (2006.01)
(52) U.S. Cl. .................. 707/698; 707/693; 711/216
(58) Field of Classification Search .............. 711/112, 711/108, 216; 726/22; 382/137; 385/295; 709/206; 707/698, 693
See application file for complete search history.

(56) References Cited

U.S. PATENT DOCUMENTS

| | | | |
|---|---|---|---|
| 5,049,881 A * | 9/1991 | Gibson et al. | 341/95 |
| 5,734,859 A * | 3/1998 | Yorimitsu et al. | 711/112 |
| 5,907,619 A * | 5/1999 | Davis | 713/176 |
| 6,012,062 A * | 1/2000 | Jagadish et al. | 1/1 |
| 6,414,610 B1 * | 7/2002 | Smith | 341/106 |
| 6,721,783 B1 * | 4/2004 | Blossman et al. | 709/206 |
| 7,092,956 B2 | 8/2006 | Ruediger | |
| 7,650,460 B2 * | 1/2010 | Cheriton | 711/108 |
| 2002/0002564 A1 * | 1/2002 | Munetsugu et al. | 707/500.1 |
| 2002/0010702 A1 * | 1/2002 | Ajtai et al. | 707/101 |
| 2002/0198895 A1 * | 12/2002 | Arnold et al. | 707/104.1 |
| 2003/0120647 A1 * | 6/2003 | Aiken et al. | 707/3 |
| 2005/0100113 A1 * | 5/2005 | Corts et al. | 375/295 |
| 2006/0193159 A1 * | 8/2006 | Tan et al. | 365/49 |
| 2007/0255758 A1 * | 11/2007 | Zheng et al. | 707/200 |
| 2008/0098083 A1 | 4/2008 | Shergill et al. | |
| 2008/0144079 A1 | 6/2008 | Pandey et al. | |
| 2008/0184001 A1 | 7/2008 | Stager | |
| 2009/0013129 A1 * | 1/2009 | Bondurant | 711/115 |
| 2009/0158427 A1 * | 6/2009 | Kim et al. | 726/22 |
| 2009/0204636 A1 * | 8/2009 | Li et al. | 707/103 Y |
| 2009/0285471 A1 * | 11/2009 | Wall et al. | 382/137 |
| 2009/0287986 A1 * | 11/2009 | Vishniac et al. | 714/819 |

(Continued)

OTHER PUBLICATIONS

Nath et al., Evaluating the Usefulness of Content Addressable Storage for High-Performance Data Intensive Applications, HPDC '08, Jun. 23-27, 2008, Boston, MA, pp. 35-44.

(Continued)

*Primary Examiner* — Giovanna Colan
(74) *Attorney, Agent, or Firm* — Lieberman & Brandsdorfer, LLC

(57) ABSTRACT

A method, system, and article for compressing an input stream of uncompressed data. The input stream is divided into one or more data segments. A hash is applied to a first data segment, and an offset and length are associated with this first segment. This hash, together with the offset and length data for the first segment, is stored in a hash table. Thereafter, a subsequent segment within the input stream is evaluated and compared with all other hash entries in the hash table, and a reference is written to a prior hash for an identified duplicate segment. The reference includes a new offset location for the subsequent segment. Similarly, a new hash is applied to an identified non-duplicate segment, with the new hash and its corresponding offset stored in the hash table. A compressed output stream of data is created from the hash table retained on storage media.

20 Claims, 6 Drawing Sheets

U.S. PATENT DOCUMENTS

2010/0125553 A1* 5/2010 Huang et al. ............... 707/661
2010/0127901 A1* 5/2010 Schneider .................. 341/51
2010/0313036 A1* 12/2010 Lumb ...................... 713/189
2010/0325132 A1* 12/2010 Liu et al. .................. 707/759
2011/0055174 A1* 3/2011 Popovski et al. ........... 707/693

OTHER PUBLICATIONS

Balachandran et al., Sequence of Hashes Compression in Data De-Duplication, IEEE, 2008.

* cited by examiner

METHOD AND APPARATUS FOR DATA COMPRESSION

BACKGROUND

1. Field of the Invention

This invention relates to data compression in a computer storage environment. More specifically, the invention relates to management of virtual machines and a data compression tool for images of the virtual machines.

2. Background of the Invention

A virtual machine is a self contained operating environment that behaves as if it is a separate computer, while allowing the sharing of underlying physical machine resources between multiple virtual machines. More specifically, each virtual machine operates as a whole machine, while a host of the virtual machine(s) manages resources to support each virtual machine. One of the challenges associated with employment of multiple virtual machines is that each machine requires storage space. While storage costs are decreasing, storage still remains an expense.

Data compression tools are known to address data storage and to alleviate concerns with storage capacity limitations. More specifically, data compression enables storage devices to store the same amount of data with fewer bits. However, prior art storage techniques do not effectively address the storage needs of the virtual machine environment, or other environments which require archiving of many gigabytes or more of data.

Accordingly, there is a need for a data compression tool that addresses the needs for compressing large quantities of data, such as that known in the virtual machine environment. More specifically, such a compression tool should identify and remove global redundancies within a large input window, without placing an undue burden on memory and data processing requirements. In one embodiment, a global redundancy is present between different virtual machines that are based on the same operating system, wherein the footprint of the files are the same, but only the user data changes between the different versions. In another embodiment, additional virtual machines can be added to an existing archive, benefiting from the global redundancies between the existing archive and the newly added virtual machines. In another embodiment, the differences between a reference data set and a target data set are detected using global redundancies. These differences can be used to create the target data set based on the reference data set, which is especially valuable in networked environments, where instead of transmitting the target data set, only the differences can be transmitted if the receiver already has the reference data set. Accordingly, the data compression tool needs to address the global redundancies by referencing them during the compression process.

BRIEF SUMMARY

This invention comprises a method, system, and article for compressing data by identifying duplicate data and referencing existing data instead of storing a duplicate copy.

In one aspect of the invention, a method is provided for compressing data. A first input stream of uncompressed data is processed for a first file. The processing of the uncompressed data includes dividing the input stream into a plurality of segments. For each segment in the input stream, a hash is applied and an offset is associated with the hashed segment. The hash together with the offset identifies the location of the segment. Both the hash and the corresponding offset for each segment is storage in a hash table. Thereafter, a subsequent segment within the first file is compared with the hashes stored in the hash table. If the subsequent segment is identified as a duplicate segment, a reference to the prior hash is written, together with an offset for the duplicate segment, without applying the hash to the duplication. Conversely, if the subsequent segment is not identified as a duplicate, a new hash is applied to the non-duplicate segment and the new hash and corresponding offset are stored in the hash table. Following the compression of the input stream, a compressed output stream of data is retained on storage media.

In another aspect of the invention, a system is provided for data compression. A processor is provided in communication with storage media with a first input stream of data for a first file local to the storage media configured to be processed for compression. A compression manager is provided in communication with the first input stream. The compression manager is configured to divide the first input stream into a plurality of segments, and to apply a hash to each segment and an offset associated with the hashed segment to identify the location of the hash. Thereafter, the compression manager stores the hash and corresponding offset for each unique segment in a hash table. A director is provided in communication with the compression manager. The director compares a subsequent segment within the first file with all other hashes in the hash table. In response to the comparison, the director references a prior hash, together with a new offset and length, for an identified duplicate segment absent application of the hash to the identified duplicate. For non-duplicate segments, the director applies a new hash to the identified non-duplicate segment and stores the new hash and corresponding offset into the hash table. Following completion of review of the segments of the first file, a compressed output stream of data is retained on storage media.

In yet another aspect of the invention, an article is provided for compressing data. A first input stream of uncompressed data is provided for a first file. A computer readable carrier is provided with computer program instructions configured to compress data of the first file. Instructions are provided to divide the input stream into a plurality of segments. For each segment, instructions are provided to apply a hash to the segment and to associate an offset with the hashed segment to identify the location of the hash. Instructions are provided to store a hash and corresponding offset for each unique segment into a hash table. Following storage of at least one segment in the hash table, instructions are provided to compare a subsequent segment within the same file with all other hashes in the hash table. Based upon the comparison, instructions are provided to write a reference to a prior hash, together with a new offset, for an identified duplicate segment absent application of the hash to the identified duplicate, to apply a new hash to an identified non-duplicate segment, and to store the new hash and corresponding offset into the hash table. Following completion of review of the segments of the first file, a compressed output stream of data is retained on storage media.

Other features and advantages of this invention will become apparent from the following detailed description of the presently preferred embodiment of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DETAILED DESCRIPTION

Figure 1:
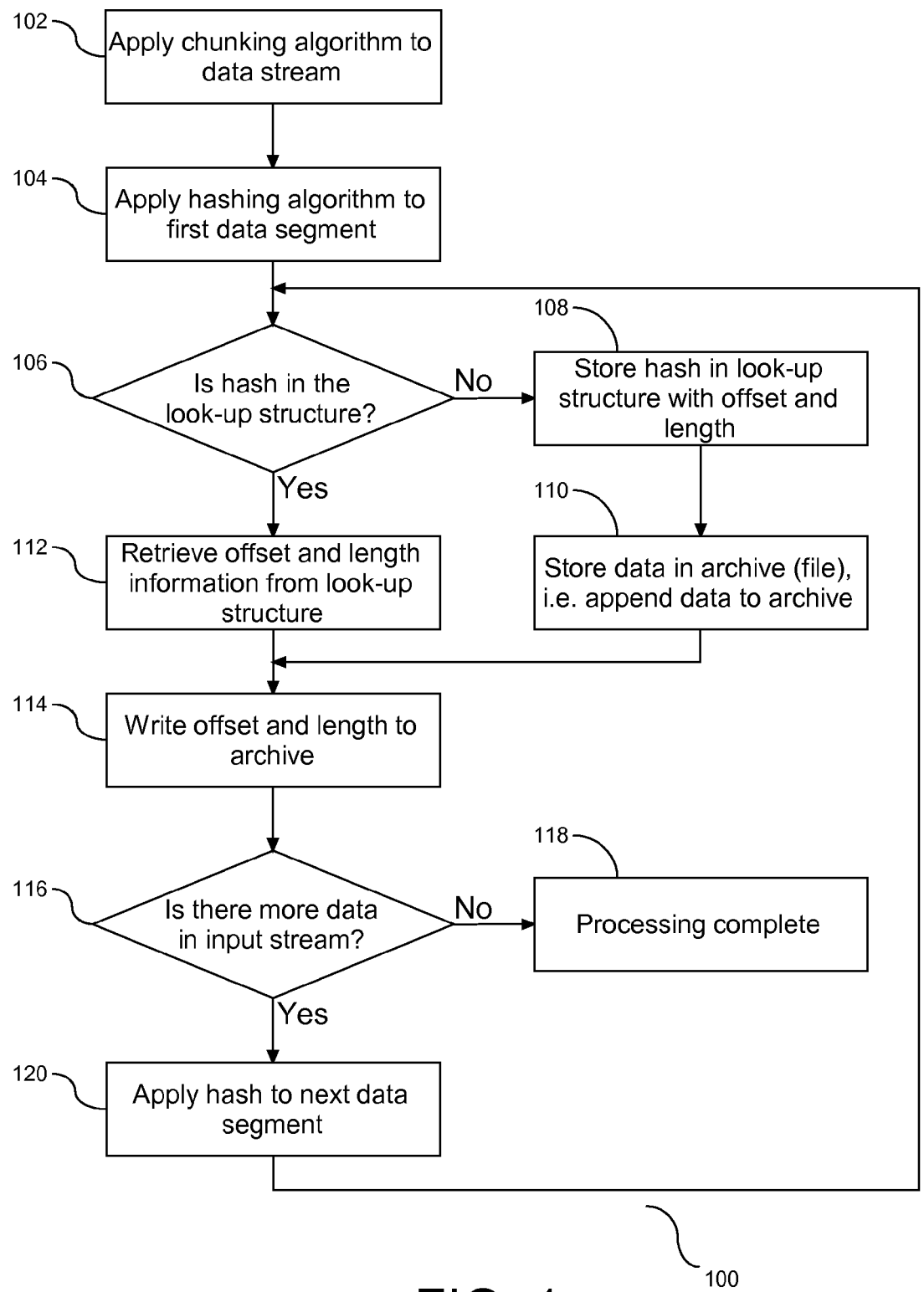
FIG. 1 is a flow chart illustrating a process for compressing an input stream of data according to the preferred embodiment of this invention, and is suggested for printing on the first page of the issued patent.

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

The functional units described in this specification have been labeled as managers and directors. A manager and/or director may be implemented in programmable hardware devices such as field programmable gate arrays, programmable array logic, programmable logic devices, or the like. The manager and/or director may also be implemented in software for processing by various types of processors. An identified manager and/or director of executable code may, for instance, comprise one or more physical or logical blocks of computer instructions which may, for instance, be organized as an object, procedure, function, or other construct. Nevertheless, the executables of an identified manager and/or director need not be physically located together, but may comprise disparate instructions stored in different locations which, when joined logically together, comprise the manager and/or director and achieve the stated purpose of the manager and/or director.

Indeed, a manager and/or director of executable code could be a single instruction, or many instructions, and may even be distributed over several different code segments, among different applications, and across several memory devices. Similarly, operational data may be identified and illustrated herein within the manager and/or director, and may be embodied in any suitable form and organized within any suitable type of data structure. The operational data may be collected as a single data set, or may be distributed over different locations including over different storage devices, and may exist, at least partially, as electronic signals on a system or network.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of a compression manager, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Overview

The large window compression tool creates compressed archives of data. In one embodiment, the compression tool compresses several similar virtual machine images using large-window de-duplication to identify changes between the different images to remove repeated data such as operating system files. Duplicate data is identified when it is written to the file system. Existing data is then referenced in place of storing a duplicate copy of the data. More specifically, data is divided into data chunks, also referred to herein as data segments, and a hash is applied to each data chunk. Segments with the same hash value are considered duplicate data. Only a single instance of a duplicate data segment is stored. The identified duplicate data segment may reference a previously stored data segment, thereby mitigating storage space. Files of the compressed data are comprised of a list of unique data segments and references to such unique data segments. During read, the files of the compressed data may be employed to reconstruct the original data based upon the stored data segments and any references to the data segments from identified duplicates thereof.

Technical Details

In the following description of the embodiments, reference is made to the accompanying drawings that form a part hereof, and which shows by way of illustration the specific embodiment in which the invention may be practiced. It is to be understood that other embodiments may be utilized because structural changes may be made without departing form the scope of the present invention.

Three core elements are employed to perform data de-duplication and create archives, including a data chunking algorithm, a data chunk hash table, and an archive format generator. There are different algorithms that may be employed for data chunking, including fixed size chunking, content aware chunking, and chunking absent content knowledge. The fixed size chunking algorithm breaks data into segments of a specific fixed size. In one embodiment, the size of the data segment can be selected to align with the physical block size of the underlying storage device to maximize storage utilization. The content aware chunking algorithm generates data chunks by parsing an input file and understanding its format. More specifically, data chunk boundaries are custom generated for the highest probability of redundancy. The chunking absent content knowledge algorithm uses the content of the data to determine chunk boundaries. More specifically, this algorithm considers the features of the byte sequence of the data to deterministically identify boundaries. Data segments produced with the chunking absent content knowledge algorithm have a high probability of being duplicates with other data segments produced with the same algorithm, because all data segments are guaranteed to end with a byte sequence that generated modulus-value bits of zeros in the rolling hash. More specifically, the chunking absent content knowledge algorithm eliminates the byte shifting issue of the fixed size chunking algorithm. Accordingly, although the chunking absent content knowledge algorithm may be preferred to provide maximum de-duplication on sequential input streams, the invention may employ any of the data chunking algorithms.

FIG. 1 is a flow chart (100) illustrating a broad aspect of compressing an input stream of data. A chunking algorithm is applied to the data stream (102), and a hashing algorithm is applied to a first data segment (104). It is then determined if the hash applied to the first data segment is present in a look-up data structure (106). In one embodiment, the look-up data structure may be in the form of a hash table. A negative response to the determination at step (106) is followed by storing the hash together with the offset and length of the subject data segment in a look-up data structure (108). In addition, the data of the subject data segment is stored in an archive (110). More specifically, the data of the subject data segment is appended to the archive. In one embodiment, the archive may take the form of a file retained in persistent storage. A positive response to the determination at step (106) is an indication that the current hash is a copy of a prior hash for a prior data segment. The offset and length information for the prior hash is retrieved from the look-up data structure (112). Following the completion of step (112) or step (110), the offset and length of the data segment being evaluated is written to the archive (114). Following step (114), it is determined if there is more data in the data stream that has not been evaluated for compression (116). A negative response to the determination at step (116) is an indication that the processing of the data stream is complete (118). Conversely, a positive response to the determination at step (116) results in further processing of the data stream. More specifically, a hash is applied to the next data segment (120), followed by a return to step (106) for further evaluation of the hashed data segment. Accordingly, a hash is applied to each unique data segment in the data stream, with unique hashes stored in a look-up data structure and the data stored and/or appended to the archive, and with non-unique hashes referencing an earlier stored hash for a duplicate data segment.

Figure 2:
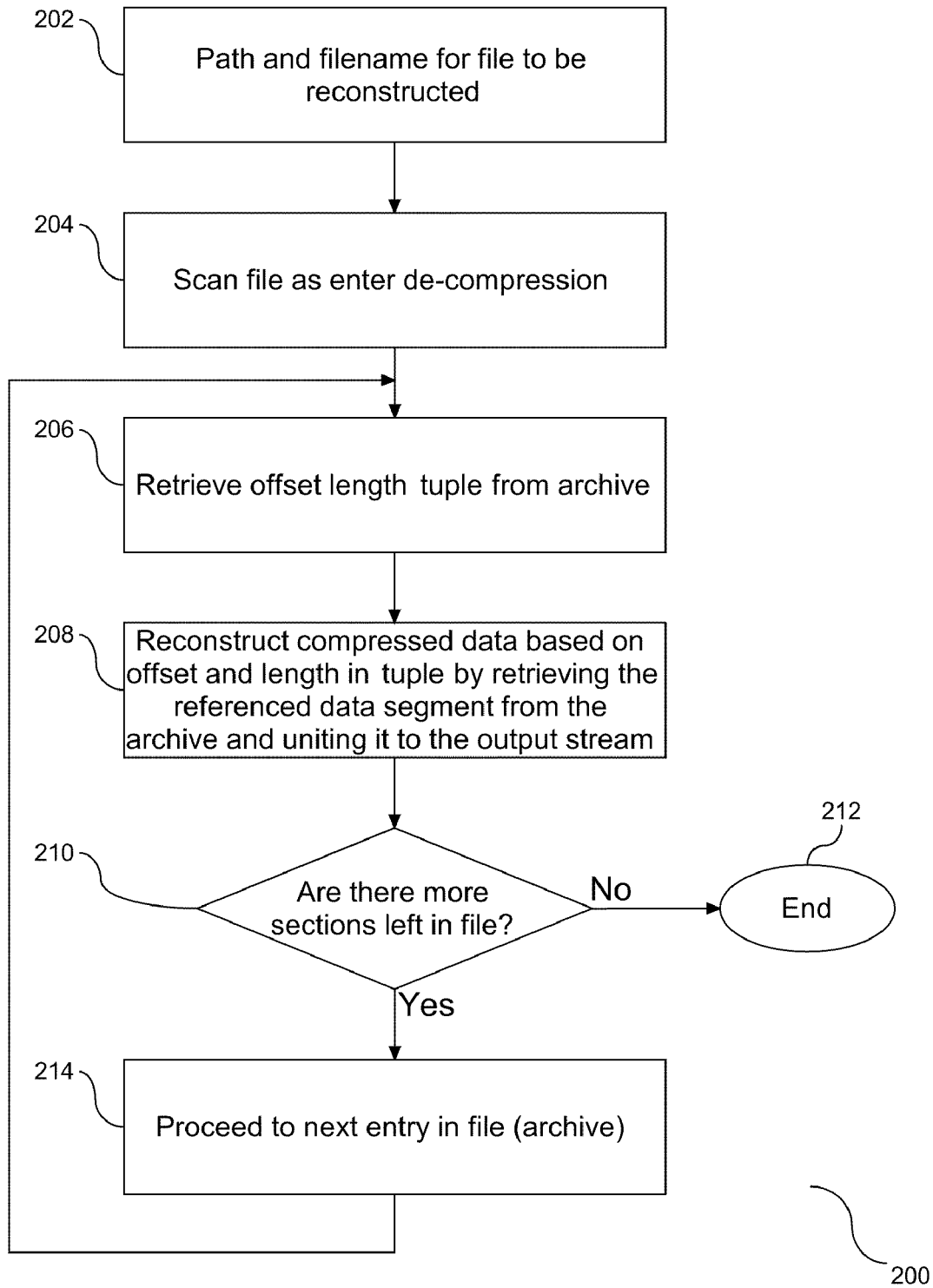
FIG. 2 is a flow chart illustrating a process for re-constructing a compressed file.

As reflected in FIG. 1, each data segment is referenced in the look-up data structure, with some data segments having a unique hash entry in the look-up data structure, and other data segments merely referencing a prior entry in the look-up data structure. The purpose of the look-up data structure and data chunking is to compress data from a file in an efficient manner. FIG. 2 is a flow chart (200) illustrating a process for re-constructing a compressed file, also referred to herein as de-compression. Initially, the path and filename for the file to be re-constructed is provided (202). As shown in FIG. 1, a look-up data structure is created to store a list of tuples for each data segment in the compressed file. This look-up data structure is employed in the re-construction process. More specifically, the compressed file is scanned as de-compression is entered (204). As the file is scanned, the offset and length of a tuple is retrieved from the archive (206). In one embodiment, each tuple is evaluated in the order in which they are present and encountered from the archive. The compressed data is reconstructed based upon the offset and length in the tuple. More specifically, the referenced data segment of the tuple is retrieved from the archive and is then written to an output stream (208). The archive identifies the next offset and length in the compressed data stream. In one embodiment, the identification is obtained from meta-data in the archive. If the data in the tuple has been previously evaluated, data is applied from a prior reference. However, if the data in the tuple has not been previously evaluated, the data is retrieved from the archive. Following step (208), it is determined if there are any tuples remaining in the archive that have not been de-compressed (210). A negative response to the determination at step (210) ends the de-compression process as the de-compression of the data stream is completed (212). Conversely, a positive response to the determination at step (208) proceeds with an evaluation of the next entry in the archive (214) followed by a return to step (206). In one embodiment, the next entry in the archive may be in the form of the next tuple. Accordingly, each offset and length tuple referenced in the look-up data structure and stored in the archive is employed to reconstruct the file, wherein duplicate data segments are referenced by a single entry and are called from a single location in the look-up data structure and/or archive.

Figure 3:
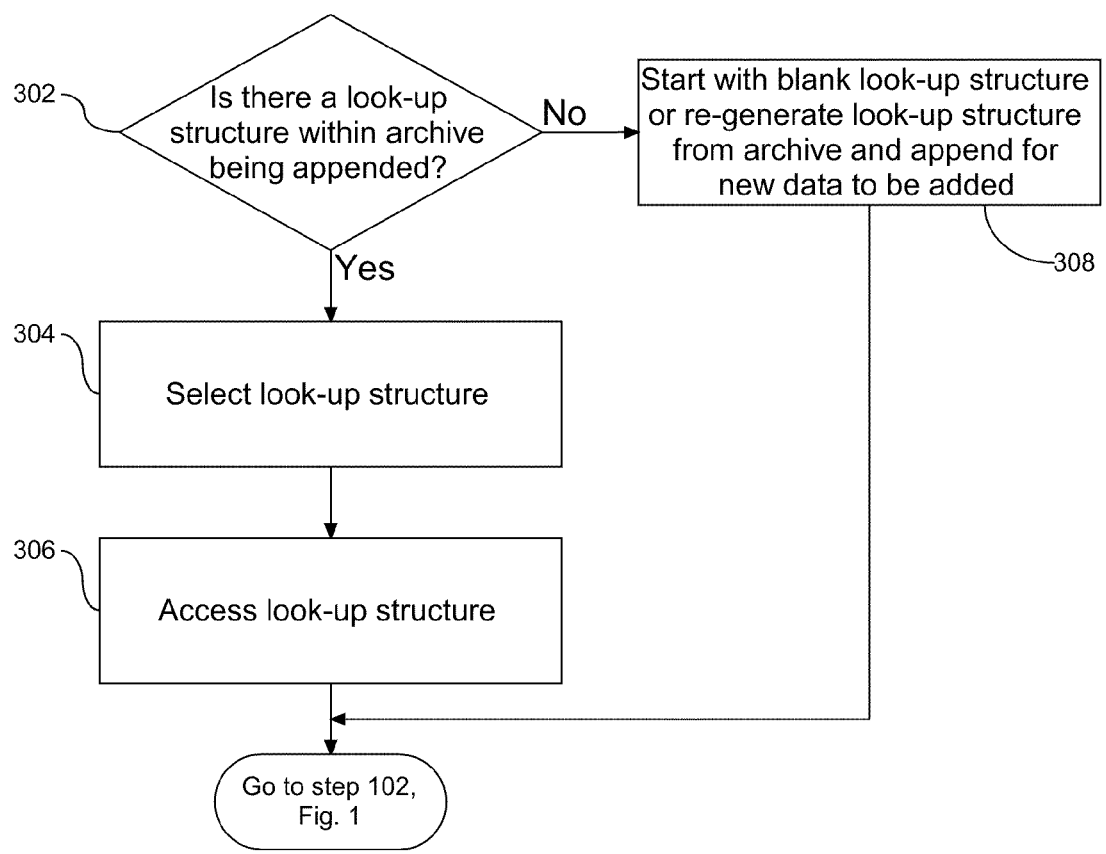
FIG. 3 is a flow chart illustrating a process for compressing a second input stream with employment of a previously created and stored hash table.

As described in detail in FIG. 1 a single input stream is divided into a plurality of data segments and compressed through the employment of a look-up data structure. When a second input stream is selected for compression, it may employ a separate look-up data structure, which merely repeats the compression process shown in FIG. 1 with employment of a new look-up data structure. However, in one embodiment, the second input stream may employ the same look-up data structure created with the compression of the first input stream, as explained in detail with reference to FIG. 3. More specifically, compression of the second input stream may be appended to the compressed and archived first input stream. It is determined if there is a look-up data structure within the archive that is subject to being appended (302). A positive response to the determination at step (302) is followed by selecting the look-up data structure (304) and accessing the look-up data structure (306). Conversely, a negative response to the determination at step (302) is followed by employing an empty look-up data structure or re-generating a look-up data structure from the archive file, wherein the look-up data structure is available to be appended and receive new data (308). Following completion of either step (306) or step (308), the compression process proceeds to step (102) of FIG. 1, wherein the second input stream is compressed. Accordingly, based upon the availability of a look-up data structure from the first input stream, an existing look-up data structure or a new look-up data structure may be employed to compress the second input stream.

In a further embodiment, processing a first file creates a first reference archive, herein referred to as referenced archive A, and adding a second file to this archive creates a target archive, herein referred to as archive A'. For distribution of data, e.g. across a network, if source and the target network nodes both contain file A, then it is possible to create a patch file, P, that can be applied to archive A to create archive A' instead of transmitting archive A' to the target node. The patch file P is created by processing the second archive as described in reference to FIG. 3, but the output is not appended to the original archive. Rather, the output is stored in a separate file, referred to herein as the patch file. This patch file can then be transmitted and appended to the archive A on the target node to create archive A'.

Similarly, in one embodiment, it is also possible to create a patch file P that encodes the difference between two files, referred to herein as files F and F', which are not archives. File F is processed as described in FIG. 3, with recordation limited to the hash values and offset-length tuples referencing into the original file F. Then file F' is processed as described in FIG. 3 and with storing new data segments and reconstruction information in a separate file. This patch file P references data segments in the uncompressed file F as well as new data segments contained in the patch file P. Applying this patch file P to file F will created file F'.

Figure 4A:
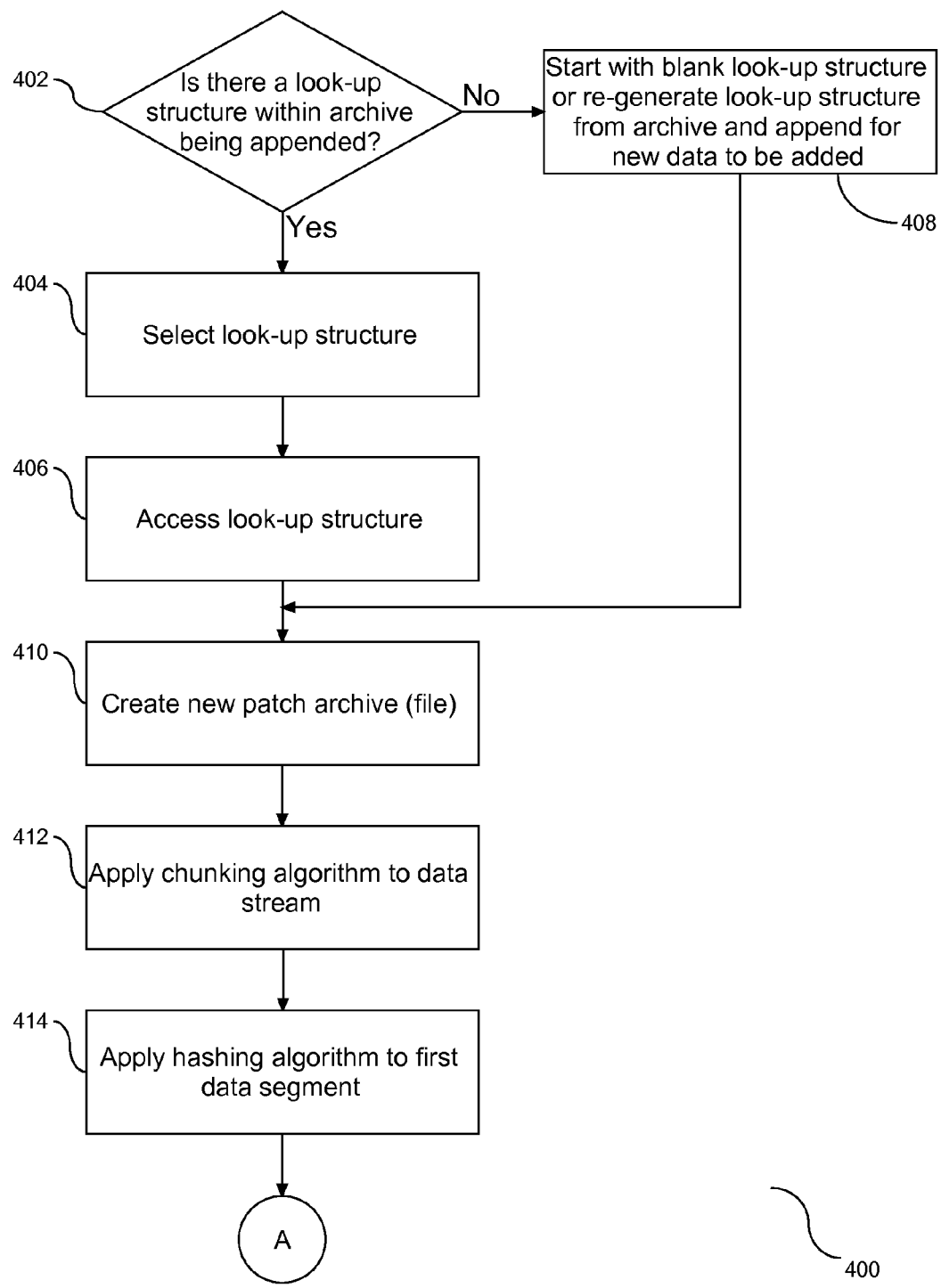
FIGS. 4A and 4B are a flow chart illustrating a process for creation of a differential archive file for retaining new data changes.
Figure 4B:
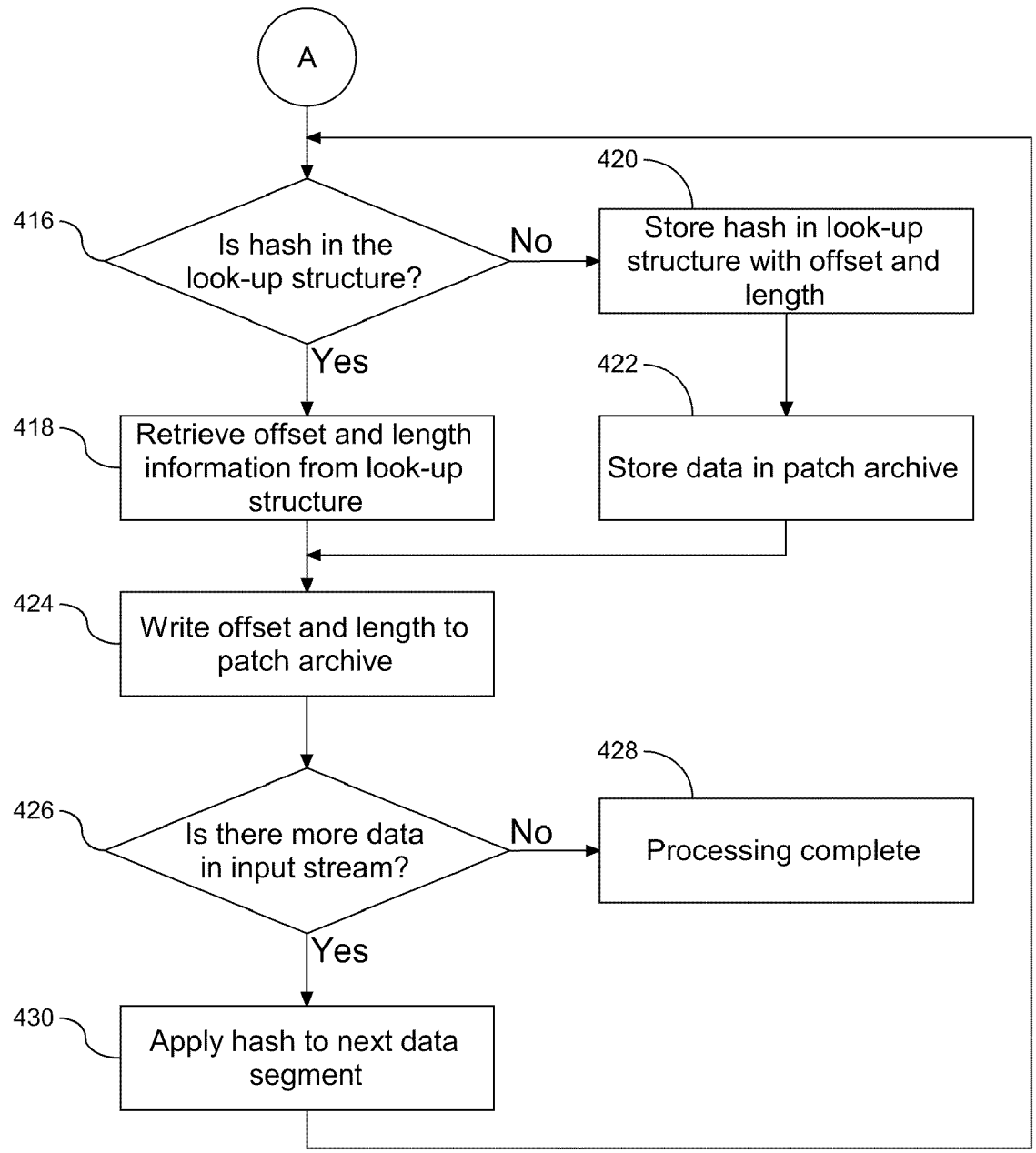

In one embodiment, a difference archive file may be created and limited to new data changes. This difference archive file can be transmitted and appended to an existing archive file, thereby eliminating the requirement to append the new data changes to an existing archive file which must then be transmitted as a single unit including both prior data changes and the new data changes. FIGS. 4A and 4B are a flow chart (400) illustrating the process for creation of the difference archive file. Initially, it is determined if there is a look-up data structure within an archive file that is being appended (402). A positive response to the determination at step (402) is followed by looking up the look-up data structure (404) and accessing the look-up data structure (406). Conversely, a negative response to the determination at step (402) is followed by employing an empty look-up data structure or re-generating a look-up data structure from an archive, and appending the re-generated look-up data structure for new data to be added to the structure (408). Following completion of the processes at either step (406) or step (408), a new patch archive file is created (410) and a chunking algorithm is applied to a data stream (412). A hashing algorithm is applied to a first data segment of the data stream (414). It is then determined it the hash produced by the hashing algorithm is present in the look-up data structure (416). A negative response to the determination at step (416) is followed by storing the hash of the data segment in the look-up structure with the offset and length of the associated data segment (420), and then storing the data in the patch archive (422).

Conversely, a positive response to the determination at step (416) is followed by retrieving offset and length information from the look-up data structure (418). Following completion of either step (422) or step (418), the offset and length of the data segment is written to the patch archive (424). As in the compression of a single file demonstrated in FIG. 1, it is then determined if there is more data present in the data stream that is subject to evaluation for compression (426). A negative response to the determination at step (426) is followed by completion of processing of the data stream (428). Conversely, a positive response to the determination at step (426) is followed by a return to step (416). Accordingly, as demonstrated herein, a patch file archive may be created and separately transmitted from a separate archive, and then appended to the separate archive.

Figure 5:
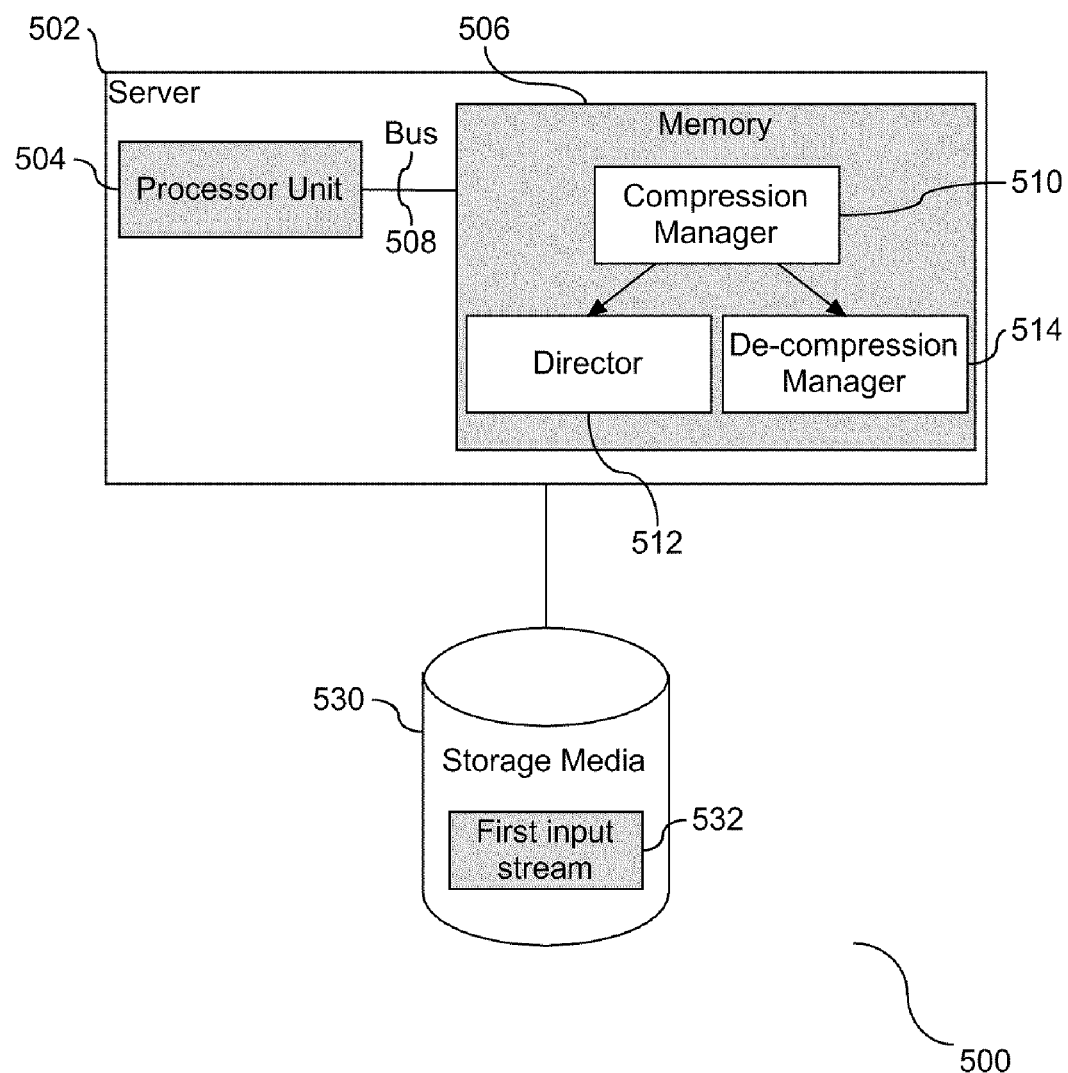
FIG. 5 is a block diagram of a computer system for compressing data through the use of a data chunking tool.

Data compression as described in FIGS. 1, 2, and 4 may employ tools embedded in a computer system. As described above, an input stream of data is processed to identify data segments and duplicate data segments, and to compress the duplicate data segments with minimal repetition. FIG. 5 is a block diagram (500) of a computer system for compressing data through the use of a data chunking tool. As shown, a server (502) is provided in communication with storage media (530), which is employed to store data. The server (502) includes a processing unit (504) in communication with memory (506) across a bus (508). Although only one processing unit (504) is shown, the invention should not be limited to the quantity shown herein. In one embodiment, two or more processing units may be provided in the server (502). The server is also provided with a compression manager (510) in communication with the processing unit (504) and memory, and data storage (530). As shown herein, a first input stream of data (532) for a first file is local to the storage media (530). However, the invention should not be limited to the locality of the first input stream of data (532). In one embodiment, the first input stream of data (532) may be received from storage media across a network connection and one that is not local to the server (502). Accordingly, the first input stream (532) is communicated to the server (502) for compression processing.

The compression manager (510) processes the input stream (532) by dividing it into a plurality of data segments. As described above, there are different data chunking algorithms that may be employed, and the compression manager (510) may select an optimal data chunking algorithm for the input stream being processed. The compression manager (510) applies a hash to each segment, and creates a tuple to associate with the hash. In one embodiment, the tuple references the offset and length of the hashed segment. The hash, together with the associated tuple, is stored in a hash table. In one embodiment, the hash table is stored in persistent storage in communication with the server (502). However, the invention should not be limited to this storage location for the hash table. As in another embodiment, the hash table may be stored in a remote storage location, memory, etc. Regardless of the storage location of the hash table, a de-compression manager (514) in communication with the compression manager (510) must be able to read the hash table to reconstruct the input stream. To mitigate the quantity of hashes created and stored in the hash table, a director (512) is provided in communication with the compression manager (510). The director (512) is provided to compare each subsequent data segment within the input stream with all hashes present in the hash table. If the director (512) identifies a duplicate data segment in the hash table, the director (512) references the entry in the hash table with an offset and length tuple for the duplicate segment. Conversely, if the director (512) determines that the subsequent data segment is not a duplicate of a prior hash table entry, the director communicates with the compression manager to apply a hash and hash table entry for the non-duplicate data segment. Once each of the data segments in the input stream has been hashed or referenced in the hash table, the compression of the input stream is completed.

As identified above, the compression manager (510) and director (512) function to create a hash table with a minimal quantity of entries. Each data segment either contains a hash entry or a reference to a prior hash entry. Once the compression of the input stream is completed, the hash table may be archived by the director (512). In one embodiment, the archive may be written to a storage device (530). Furthermore, as described above in FIG. 2, each compressed input stream may be re-created through use of a de-compression manager (514). More specifically, during the de-compression process the de-compression manager communicates with the compression manager (510) to re-generate one or more data segments referenced in the hash table. Accordingly, the compression manager (510) and director (512) are employed to compress the input stream of data, and the de-compression manager (514) together with the compression manager (510) are employed to re-generate the compressed data referenced in the hash table.

As shown herein, the managers (510) and (514), and director (512) each reside in memory (506) local to the server (502). In one embodiment, the managers and director may reside as hardware tools external to local memory, or they may be implemented as a combination of hardware and software. Similarly, in one embodiment, the managers and director may be combined into a single functional item that incorporates the functionality of the separate items. As shown herein, each of the managers and director are local to the server (502). However, in one embodiment they may be collectively or individually distributed across the network and function as a unit to process one or more input streams of data for compression and/or de-compression. Accordingly, the managers and director may be implemented as software tools, hardware tools, or a combination of software and hardware tools, to collect and organize data content.

Embodiments within the scope of the present invention also include articles of manufacture comprising program storage means having encoded therein program code. Such program storage means can be any available media which can be accessed by a general purpose or special purpose computer. By way of example, and not limitation, such program storage means can include RAM, ROM, EEPROM, CD-ROM, or other optical disk storage, magnetic disk storage or other magnetic storage devices, or any other medium which can be used to store the desired program code means and which can be accessed by a general purpose or special purpose computer. Combinations of the above should also be included in the scope of the program storage means.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, random access memory (RAM), read-only memory (ROM), a rigid magnetic disk, and an optical disk. Current examples of optical disks include compact disk B read only (CD-ROM), compact disk B read/write (CD-R/W) and DVD.

A data processing system suitable for storing and/or executing program code will include at least one processor coupled directly or indirectly to memory elements through a system bus. The memory elements can include local memory employed during actual processing of the program code, bulk storage, and cache memories which provide temporary storage of at least some program code in order to reduce the number of times code must be retrieved from bulk storage during processing.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening networks.

The software implementation can take the form of a computer program product accessible from a computer-useable or computer-readable medium providing program code for use by or in connection with a computer or any instruction processing system. In one embodiment, instructions are provided to process an input stream of uncompressed data for compression. More specifically, instructions are provided to process segments of data, to hash unique segments of data and to store these unique segments in a hash table entry, with the hash table entry including a segment length and offset location from the original input stream. For duplicate data segments, instructions are provided to reference a previously stored hash entry in the hash table with an offset for the duplicate segment. In one embodiment, this reference to the previously stored entry may include the length of the segment. Accordingly, once processing the input stream is completed, the input stream is compressed.

In addition to compressing the input stream of data, instructions are provided to re-constructing the compressed input stream. More specifically, instructions are provided to reference the hash table and to extract entries therefrom to re-process data stored in the hash table. Since the hash table only contains hashes for unique data segment, the instructions only need to de-compress the unique hash entries, as the duplicate entries merely need to be placed in the proper offset location during the reconstruction of the compressed input stream. During the de-compression process, instructions are provided to communication with the instructions that compressed the data so that the hash signature from the compression may be employed to re-create the input stream of data.

Advantages

The method, system, and article for data compression supports processing an input stream of un-compressed data to produce an output stream of compressed data in a single pass. More specifically, the compression process is platform independent without requiring specialized hardware. Through experimentation it has been found that the compression ratio for block sizes is optimal for a range of 2 KB to 8 KB to yield a good folding factor. Accordingly, an optimal data segment length is employed with a data chunking algorithm to divide the input stream into multiple segments and to efficiently compress the input stream by eliminating duplicate entries of data segments in the hash table.

Alternative Embodiments

It will be appreciated that, although specific embodiments of the invention have been described herein for purposes of illustration, various modifications may be made without departing from the spirit and scope of the invention. In particular, in one embodiment, the hash data from the data chunking is not stored. Without the hash data, new data chunks cannot be directly compared to existing data chunks. However, the original hash table can be rebuilt by re-chunking and re-hashing the existing archive. Another aspect of this invention is that additional virtual machines can be added to an existing archive, benefiting from the global redundancies between the existing archive and the newly added virtual machines. The new input stream of uncompressed data may be split into data segments and a hash may be applied to each segment. The hash is then compared to the existing look-up data structure from the existing archive. If the archive did not store the look-up data, then the archive data needs to be processed in aforementioned fashion to re-create the look-up data structure. Accordingly, the scope of protection of this invention is limited only by the following claims and their equivalents.

We claim:

1. A data compression method comprising:
processing a first input stream of uncompressed data for a first file, including dividing the input stream into a plurality of segments, the size of the segments defined by a dividing algorithm determining segment boundaries based on data content;
for each segment, applying a hash to a segment and associating an offset and length with the hashed segment for identifying the location and size of the segment;
identifying whether the segment is unique by comparing the hash of the segment with all other hashes previously stored in a hash table;
storing the hash and corresponding offset and length for the segment into the hash table responsive to determining that the segment is unique;
streaming data for the unique segment into an output stream; and compressing data in the output stream, wherein an uncompressed segment of a second input stream is appended to a first compressed input stream based upon data in the hash table, including employing the hash table from the first file for creating a unique hash and associated offset for all non-duplicate segments.

2. The method of claim 1, further comprising identifying a length of each segment and storing the identified length with the offset for the segment.

3. The method of claim 1, wherein the step of dividing the input stream into a plurality of segments employs a segmenting algorithm selected from the group consisting of: fixed block size, absent content knowledge, and content aware.

4. The method of claim 1, further comprising storing all hash information from the hash table into an archive.

5. The method of claim 4, further comprising appending compression of a second input stream to a compressed and archived first input stream.

6. The method of claim 1, further comprising re-generating hashes from the compressed output stream, including re-processing data stored in a hash table archive to provide original hash information for adding a new file into an existing archive.

7. The method of claim 1, further comprising a user setting the segment size.

8. A system for data compression, comprising:
a processor in communication with storage media; a first input stream of data for a first file local to the storage media configured to be processed for compression;
a compression manager in communication with the first input stream, the manager to divide the first input stream into a plurality of segments, the size of the segments defined by a dividing algorithm determining segment boundaries based on data content;
the compression manager to apply a hash to each segment, and an offset and length identifier associated with the hashed segment to identify the location and size of the hash;
a director in communication with the compression manager, the director to identify whether the segment is unique by comparing the hash of the segment within the first file with all other hashes previously stored in a hash table;
the compression manager to store the hash and corresponding offset and length for the segment into the hash table responsive to determining that the segment is unique;
the compression manager to stream data for the unique segment into an output stream; and
the compression manager to compress data in the output stream, wherein an uncompressed segment of a second input stream is appended to a first compressed input stream based upon data in the hash table table, including employing the hash table from the first file to create a unique hash and associated offset for a non-duplicate segment.

9. The system of claim 8, further comprising the compression manager to identify a length of each segment and to store the identified length with the offset for the segment.

10. The system of claim 8, wherein the division of the input stream into a plurality of segments by the manager employs a segmenting algorithm selected from the group consisting of: fixed block size, absent content knowledge, and content aware.

11. The system of claim 8, further comprising the director to store all hash information from the hash table into an archive.

12. The system of claim 11, further comprising the compression manager to write the archive to a storage device.

13. The system of claim 8, further comprising a de-compression manager in communication with the compression manager, the de-compression manager to re-generate a hash from the compressed output stream and to re-process data stored in a hash table archive to provide original hash information for adding a new file into an existing archive.

14. The system of claim 8, further comprising a user to set the segment size.

15. An article for compressing data, comprising:
a first input stream of uncompressed data for a first file;
a computer readable carrier including computer program instructions configured to compress data of the first file, the instructions comprising: instructions to divide the input stream into a plurality of segments, the size of the segments defined by a dividing algorithm determining segment boundaries based on data content;
for each segment, instructions to apply a hash to the segment and to associate an offset with the hashed segment to identify the location of the hash;
instructions to identify whether the segment is unique by comparing the hash of the segment within the same file with all other hashes in the hash table; and instructions to store the hash and corresponding offset and length for the segment into the hash table responsive to determining that the segment is unique;
instructions to stream data for each unique segment into an output stream; and
instructions to compress data, wherein an uncompressed segment of a second input stream is appended to a first compressed input stream based upon data in the hash table table, including employing the hash table from the first file for creating a unique hash and associated offset for a non-duplicate segment.

16. The article of claim 15, further comprising instructions to identify a length of each segment and to store the identified length with the offset for the segment.

17. The article of claim 15, wherein instructions to divide the input stream into a plurality of segments employs a segmenting algorithm selected from the group consisting of: fixed block size, absent content knowledge, and content aware.

18. The article of claim 15, further comprising instructions to store all hash information from the hash table into an archive.

19. The article of claim 18, further comprising instructions to write the archive to a storage device.

20. The article of claim 15, further comprising instructions to re-generate hashes from the compressed output stream, including instructions to re-process data stored in a hash table archive to provide original hash information for adding a new file into an existing archive.

* * * * *